May 2, 1961 B. G. BENDER ET AL 2,982,892

SEMICONDUCTOR DEVICE AND METHOD OF MAKING THE SAME

Filed June 11, 1958

Bob G. Bender,
William B. Warren,
*INVENTORS.*
*BY.*

Billy A. Robbins

*ATTORNEY.*

United States Patent Office 2,982,892

Patented May 2, 1961

2,982,892

SEMICONDUCTOR DEVICE AND METHOD OF MAKING THE SAME

Bob G. Bender, Garden Grove, and William B. Warren, Los Angeles, Calif., assignors to Hughes Aircraft Company, Culver City, Calif., a corporation of Delaware Filed June 11, 1958, Ser. No. 741,270

4 Claims. (Cl. 317—234)

This invention relates generally to semiconductor devices and more particularly to an improved semiconductor device and method of making the same.

In the prior art it has been customary to mount semiconductor bodies within a housing for encapsulating same by utilizing a thermosetting compound containing conductive metallic particles suspended therein, or by soldering the semiconductor body to a post or other element for mounting, or by utilizing pressure upon the semiconductor body as by a spring in order to retain it in place.

In order to provide electrical contact to the body other than by the mount therefor, it has been customary to do so by means of a contact element which is held in place upon the surface of a semiconductor body by spring pressure that is inherent within the contact element, by welding, such as the welding of a point contact whisker to the semiconductor body, by solder or by a thermosetting resin about the point of contact upon the semiconductor body.

While the above ways of mounting and providing electrical contact have proved successful in many applications, certain disadvantages have resulted. When thermosetting compounds are utilized contaminants to the surface of the semiconductor body are many times sealed within the package. Utilizing pressure only to maintain contact has often resulted in unwanted noise being generated when the device is subject to vibration or acceleration. By soldering, a low survival temperature is imparted to the device. When welding is used a relatively high temperature is imparted to a portion of the semiconductor body which often causes that portion of the surface of the body to deteriorate.

Furthermore, by utilizing the above ways of anchoring a semiconductor body within a housing therefor, or to make electrical contact to other parts of the semiconductor body, many additional steps are required in the manufacture of the device. For example, where a thermosetting compound is used to anchor the body, the body must be handled separately to apply the compound and the combination must thereafter be baked for a predetermined time on the order of hours to set the compound and drive off the volatile elements therein. If solder is used, it must be separately applied and flux is called for to obtain good wetting. By utilizing these ways, therefore, much time is expended on each device in the manufacture thereof.

Accordingly, it is an object of the present invention to provide a semiconductor device which remains stable at high temperatures and, therefore, provides high operating and survival temperatures for semiconductor devices.

It is another object of the present invention to provide a semiconductor device from which contaminants have been excluded during the manufacture thereof.

It is still another object of the present invention to provide a semiconductor device which is substantially noise free under extreme acceleration and vibration.

It is a further object of the present invention to provide a method of making semiconductor devices which eliminates the necessity of bringing contaminating matter into contact with the semiconductor body.

It is a still further object of the present invention to provide a method of making semiconductor devices which is more efficient than heretofore known to the art.

It is yet a further object of the present invention to provide a method of making semiconductor devices which produces more reliable devices than heretofore known to the art.

A semiconductor device in accordance with the present invention includes a member containing cadmium which is alloyed into at least a portion of an electrical conductor. The body is affixed to the pedestal by an additional alloy which contacts both the body and the pedestal and which includes the material from the pedestal. An electrical contact element is in contact with at least a portion of one surface of a semiconductor body and an alloy is provided which contacts the semiconductor body and the electrical contact element and which includes as a constituent thereof cadmium whereby the contact element is bonded to the surface of the semiconductor body.

The method in accordance with the present invention includes the steps of alloying an element including cadmium to a member contained within a housing for a semiconductor body. A layer of metal adapted to form an alloy with the element is then applied to contact the body and element and is then alloyed with said element.

Other and more specific objects of the present invention will become apparent from a consideration of the following description taken in conjunction with the accompanying drawing which is presented by way of illustration only and is not intended as limiting the scope of this invention, and in which.

Figure 1:
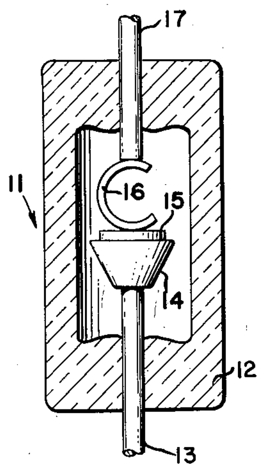
Fig. 1 is a schematic diagram partly in cross section illustrating an encapsulated device constructed in accordance with the present invention.

Referring now to the drawing and more particularly to Fig. 1 thereof, there is shown a semiconductor diode 11. Diode 11 includes a housing 12 which encapsulates a semiconductor body and its electrical contacts. Housing 12 may be constructed from an insulative material, such as glass, as illustrated in Fig. 1. It is to be understood, however, that a housing may be constructed of any material which is desired. If a glass package, such as shown at 12 in Fig. 1, is utilized it may be constructed as described in Patent No. 2,736,847, issued to S. H. Barnes on February 28, 1956. Electrical conductors 13 and 17 protrude through and into housing 12 and provide a hermetic seal for the semiconductor diode contained within the housing. Attached to electrical conductor or lead 13 is a member or pedestal 14 upon which semiconductor body 15 is mounted. An electrode 16 is affixed to lead 17 and makes contact with the upper surface of semiconductor body 15. Electrode 16 may be a spring as shown which takes the form of a C, or in the alternative it may be S-shaped, straight or a typical point contact or a whisker electrode such as is presently well known in the art.

Figure 2:
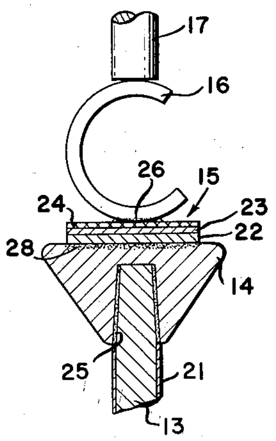
Fig. 2 is a schematic diagram partly in cross section illustrating more in detail a portion of the device as shown in Fig. 1, and Figs. 3 and 4 are schematic diagrams partly in cross section of alternative embodiments of semiconductor devices at intermediate stages of manufacture in accordance with the method of the present invention.

Referring now more particularly to Fig. 2, the internal portions of device 11, as illustrated in Fig. 1, are shown more in detail. As illustrated in Fig. 2, lead 13 contains an outer coating 21. Outer coating 21 is a material which will alloy with the material utilized for member 14 and may be applied to lead 13 by any means known to the art such as, for example, plating, evaporating, dipping, cladding and the like. In the alternative, lead 13 may be constructed entirely of material which will alloy with the material of element 14. Element or pedestal 14 includes as at least one of its constituents the element cadmium. In the presently preferred embodiment, therefore, layer 21 on lead 13 may include at least one of antimony, lead, nickel, silver, gold, copper, tin, zinc, aluminum or magnesium.

Semiconductor body 15 which, as illustrated in Fig. 2, includes a semiconductor crystal 22 having therein a region 23 which is of the opposite conductivity type from crystal 22 and in contact with region 23 an alloy 24 consisting of atoms of the semiconductor crystal and of the material deposited thereon to form region 23. A semiconductor body as illustrated in Fig. 2 may be constructed in accordance with Patent No. 2,789,068, issued to J. Maserjian on April 16, 1957. While such a semiconductor body is illustrated in Fig. 2, it is to be expressly understood that the body may take any form presently known to the art and may be constructed by any method presently known to the art such as, for example, fusion, diffusion, particle bombardment, and the like in order to form junctions or may simply be a body of semiconductor material having a whisker element in point relationship therewith. The semiconductor body is brought into contact with pedestal 14 and a slight pressure is exerted therebetween. The body and the pedestal in combination are then heated to a temperature so that an alloy is formed including material from the pedestal 14 whereby body 15 is bonded to pedestal 14. The formation of this alloy is more fully explained hereinbelow.

An electrical contact element 16 is affixed to lead 17. This may be done, for example, by resistance welding techniques which are presently known to the art. Whisker 16 may be constructed from any material presently known to the art which will provide good electrical conduction between lead 17 and the semiconductor body. Such materials may be, for example, platinum, copper, aluminum, silver and the like. Contact element 16 is affixed to the surface of the semiconductor body by an alloy as shown at 26 in Fig. 2. This alloy contacts both element 16 and the semiconductor body and bonds the element to the surface of the body. Alloy 26 may be formed by any method presently known to the art. However, in the presently preferred embodiment, alloy 26 is formed by applying a layer of material, including cadmium at least upon that portion of element 16 which is to contact the semiconductor body. An additional layer of material which will form an alloy with the material applied to element 16 is then deposited upon the surface of the semiconductor body. Examples of materials which may be utilized are antimony, lead, nickel, silver, gold, copper, tin, zinc, aluminum or magnesium. In the presently preferred embodiment of the present invention, it has been found that gold works exceedingly well as the material to alloy with the cadmium containing layer of material upon element 16. The thickness of the gold which is applied to the semiconductor body is not considered to be critical so long as sufficient material is provided to obtain alloying with the material applied to element 16 and it has been found that approximately 0.2 mil in thickness is sufficient. The contact element and the semiconductor body are then brought together and heated to a temperature above the eutectic temperature of the gold and the cadmium but below the temperature at which deterioration of the semiconductor device components will begin. An alloy is thereby formed between the element 16 and the semiconductor body. The combination is then cooled to solidify the alloy and provide a bond between the two elements. A eutectic alloy is formed in most instances.

Alternatively, element 16 may be made of cadmium thus eliminating the application of a layer of material to the element. Furthermore, it oftentimes becomes desirable to apply a doping material during or before an alloying process in order to assure that good ohmic contact is made between the contact element and the semiconductor body. If such is desirable, this may be accomplished by applying the doping material to the layer of gold which is deposited upon the semiconductor body or by applying the doping material to the contact element 16.

Pedestal 14 is alloyed to lead 13 to provide a connection which is permanent and will not deteriorate when subjected to high temperature. The alloy connection between pedestal 14 and lead 13 is illustrated at 25 and the formation thereof is more fully explained hereinafter.

Semiconductor body 15 is attached to pedestal 14 by an alloy as shown at 28 in Fig. 2 and more fully explained hereinafter. Alloy connections 25 and 28 are in the presently preferred embodiment eutectic alloys.

Although each of the materials listed above have been found to work well in the formation of an alloy with cadmium, tin and lead should not be used if it becomes desirable to produce a semiconductor device which has a survival temperature of the order of 300° C. Under such circumstances the remaining materials listed provide excellent bonds. In order to provide an indication of probable temperature limits of devices constructed with the various materials above set forth but without restricting the scope of the present invention, the following table is provided:

| Material Alloyed with Cadmium | Percent Cadmium in Eutectic | Eutectic Temperature, Degrees C. |
|---|---|---|
| Lead | 17.5 | 248 |
| Antimony | 92.5 | 290 |
| Nickel | 97.5 | 318 |
| Silver | 93–97 | 343–400 |
| Gold | 88 | 309 |
| Copper | 88 | 314 |
| Tin | 67.75 | 170 |
| Zinc | 82.5 | 265 |
| Aluminum 21%; Magnesium 53% | 26 | 420 |

Figure 3:
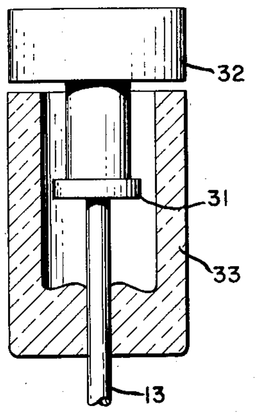

Referring now more particularly to Fig. 3, there is shown a device of the present invention in one of the first steps of manufacture in accordance with the method of the present invention whereby the pedestal 14 is affixed to lead 13.

A slug 31 of cadmium or of an alloy of cadmium and one of the materials above listed may be placed upon lead 13 as contained within an open-ended portion 33 of the encapsulating means 12 as illustrated in Fig. 1. A weight 32 is then inserted within the open-ended encapsulating means to rest upon the slug of material 31 and to exert slight pressure between it and lead 13. It has been found that approximately 2 grams is sufficient to enable weight 32 to apply the needed pressure. This combination is then passed through a furnace, such as a typical tape furnace, wherein the temperature is raised to above the melting point of the slug of material in order to cause it to melt and assume the shape as shown in Fig. 1 or Fig. 2. Upon melting, it will also dissolve that portion of coating 21 upon lead 13, as shown in Fig. 2, which it contacts thereby forming an alloy mixture between the two materials which is preferably an eutectic alloy. If, for example, coating 21 upon lead 13 is copper and pedestal 14 is constructed of cadmium, the temperature to which the combination would be raised would be approximately 321° C. Preferably, it has been found that the temperature cycle within the tape furnace should be adjusted so that the rise to 321° C. is at a rate of about 25° C. per minute. The temperature of 321° C. should be maintained for about 2 minutes. The combination is then cooled at a rate of about 25° C. per minute to thereby form an eutectic alloy bond as illustrated at 25 in Fig. 2 between pedestal 14 and lead 13.

After slug 31 assumes the shape desired, as shown at 14 of Fig. 1, and is alloyed to lead 13, weight 32 is removed and a semiconductor body is placed upon the flat surface of element 14. Prior to this a layer of metal which is adapted to alloy with element 14 is preferably applied to the surface of the semiconductor body which is to contact element 14. This may be done by any means known to the art but plating is presently preferred. If gold is used as the metal to alloy with element 14, about 0.2 mil in thickness has proved adequate. Thereafter weight 32 is replaced and the combination is heated to a temperature above the eutectic temperature of the metal applied and the element 14. If gold and cadmium are used, the eutectic temperature is 319° C.

Alternatively the above two steps may be carried out simultaneously by placing the semiconductor body upon slug 31 prior to the first heating. After the body is alloyed to element 14 which is in turn alloyed to lead 13, the contact element may then be alloyed to the other surface of the body to provide a completely alloyed unit as shown in Fig. 1.

Figure 4:
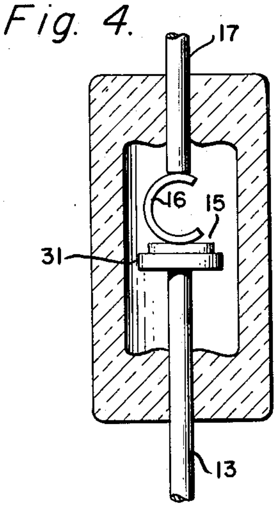

By now referring to Fig. 4, it may be seen that the entire device may be constructed by one pass through the tape furnace. This is accomplished by leading slug 31 upon lead 13, the body 15 upon the slug and then bringing contact element 16 into contact with body 15. Lead 17 and contact element 16 are advanced sufficiently to provide the desired pressure and then the housing is sealed. Thereafter the sealed housing is passed through the tape furnace to cause complete alloying of the internal parts of the device to provide the stable finished product.

Figure 5:
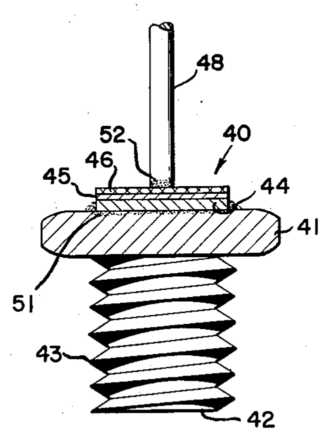
Figs. 5 and 6 are schematic diagrams partly in cross section of alternative embodiments of semiconductor devices in accordance with the present invention.

Referring now more particularly to Fig. 5, there is shown an alternative embodiment of a semiconductor device employing the present invention and as illustrated therein a mounting member 41 is provided, having a stud 42 provided with threads 43 attached thereto. Stud 42 may be utilized to attach the completed semiconductor device to a chassis or other member for further utilization, and operates also as a heat sink. Affixed to mounting member 41 is a semiconductor body 40 which includes a semiconductor crystal 44 having a region 45 of a conductivity type opposite to that of the crystal and attached to region 45 is an alloy region 46. The semiconductor body, as shown in Fig. 5, may be constructed in accordance with the method described in conjunction with Fig. 2 above.

Semiconductor body 40 is affixed to mounting member 41 by alloying as above described. A layer of cadmium of an alloy of cadmium and one of the above metals is preferably applied to member 41. A layer of one of the above materials which will form an eutectic alloy with cadmium is placed upon the body 40, preferably gold is used. The body 40 is then brought into contact with member 41 and heated to form an alloy as shown at 51. Alternatively, however, member 41 may be formed of cadmium and the alloying material applied thereto.

A lead 48 is brought into contact and alloyed with the semiconductor body and positive contact is provided between the semiconductor body and mount 41 by an alloy as illustrated at 52.

This alloy is formed by placing a layer of cadmium, or an alloy thereof, on body 40 and then contacting lead 48, which will have at least the end portion thereof coated with one of the materials above listed, with body 40. Thereafter the combination is heated to form the alloy. Alternatively the lead 48 may be constructed entirely of one of the above listed metals and cadmium may be applied thereto.

Figure 6:
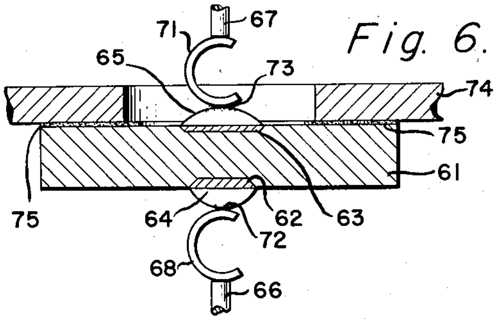

Referring now more particularly to Fig. 6, there is shown a transistor which includes a semiconductor body 61 having converted regions 62 and 63 of opposite conductivity type from that of the body. Alloy buttons 64 and 65 are in contact with converted regions 62 and 63, respectively. Leads 66 and 67 have contact elements 68 and 71 affixed as by resistance welding thereto, respectively. These contact elements are alloyed to buttons 64 and 65 to form a positive contact as hereinabove described and as shown at 72 and 73. Additionally a mounting member 74 is alloyed to the semiconductor body as shown at 75 and hereinabove described.

There has thus been described a semiconductor device wherein all the internal elements are alloyed together to provide a stable device which is free of contaminants and noise. There has also been described the method of manufacturing such a device.

What is claimed is:

1. A semiconductor device comprising: a semiconductor body, a mounting element for said body, first and second electrodes, a first eutectic alloy between said mounting element and said first electrode, a second eutectic alloy between said body and said mouting element, and a third eutectic alloy between said second electrode and said body, each of said alloys including cadmium.

2. A semiconductor device comprising: a silicon semiconductor body, a mounting element for said body, an electrode for making electrical contact to said body, a first gold-cadmium eutectic alloy between said body and said mounting element, and a second gold-cadmium eutectic alloy between said electrode and said body.

3. A transistor comprising: a silicon semiconductor body having first and second regions therein of a conductivity type opposite to that of said body, first and second alloy buttons in contact with said first and second regions, respectively, a mounting member for said body, first and second electrodes, first and second cadmium-gold eutectic alloys between said first and second buttons and said first and second electrodes, respectively, and a third cadmium-gold eutectic alloy between said mounting element and said body.

4. A semiconductor device comprising: a semiconductor body, a pedestal including cadmium for mounting said body, a first electrode, a eutectic alloy including cadmium between said first electrode and said pedestal, a second eutectic alloy including cadmium between said body and said pedestal, a second electrode, and a third-eutectic alloy including cadmium between said second electrode and said body.

References Cited in the file of this patent

UNITED STATES PATENTS

| | | |
|---|---|---|
| 2,777,974 | Brattain et al. | Jan. 15, 1957 |
| 2,780,758 | Zetwo | Feb. 5, 1957 |
| 2,782,492 | Frost | Feb. 6, 1957 |
| 2,793,420 | Johnston et al. | May 28, 1957 |
| 2,796,563 | Ebers et al. | June 18, 1957 |
| 2,873,216 | Schnable | Feb. 10, 1959 |